(12) United States Patent
Karamanis et al.

(10) Patent No.: US 12,262,509 B2
(45) Date of Patent: Mar. 25, 2025

(54) COMPLIANT THERMAL MANAGEMENT DEVICES, SYSTEMS, AND METHODS OF FABRICATION THEREOF

(71) Applicant: Transport Phenomena Technologies, LLC, Medford, MA (US)

(72) Inventors: Georgios Karamanis, Medford, MA (US); Marc Scott Hodes, Cambridge, MA (US)

( * ) Notice: Subject to any disclaimer, the term of this patent is extended or adjusted under 35 U.S.C. 154(b) by 145 days.

(21) Appl. No.: 17/929,352

(22) Filed: Sep. 2, 2022

(65) Prior Publication Data

US 2022/0418162 A1    Dec. 29, 2022

Related U.S. Application Data

(63) Continuation of application No. PCT/US2021/020950, filed on Mar. 4, 2021.
(Continued)

(51) Int. Cl.
*H05K 7/20* (2006.01)
*H01L 23/427* (2006.01)

(52) U.S. Cl.
CPC ....... *H05K 7/20336* (2013.01); *H01L 23/427* (2013.01)

(58) Field of Classification Search
None
See application file for complete search history.

(56) References Cited

U.S. PATENT DOCUMENTS

| 4,381,032 A | 4/1983 | Cutchaw |
| 4,951,740 A | 8/1990 | Peterson et al. |

(Continued)

FOREIGN PATENT DOCUMENTS

| CN | 102427656 A | 4/2012 |
| WO | 9528073 A1 | 10/1995 |

(Continued)

OTHER PUBLICATIONS

European Patent Office "International Preliminary Report on Patentability," issued in related International Patent Application No. PCT/US2021/020950, mailed Sep. 6, 2022 (8 pages).
(Continued)

*Primary Examiner* — Mukundbhai G Patel
(74) *Attorney, Agent, or Firm* — THE MARBURY LAW GROUP, PLLC

(57) ABSTRACT

Thermal management devices, systems, and methods of fabrication thereof are generally directed to accommodating variability in height, shape, or other geometric features of one or more heat-dissipating components on a substrate while maintaining efficient transfer of heat away from the one or more heat-dissipating components. For example, a thermal management device may include a housing, a diaphragm, and a wick, the wick disposed along a chamber defined by the housing and the diaphragm such that a fluid within the chamber may evaporate and condense along the chamber to transfer heat away from one or more heat-dissipating components (e.g., electronic components or photonics). The diaphragm may be resiliently flexible relative to the housing to bias a contact surface of the diaphragm against one or more heat-dissipating components while maintaining efficient transfer of heat through the chamber and away from the one or more heat-dissipating components.

19 Claims, 10 Drawing Sheets

Related U.S. Application Data

(60) Provisional application No. 62/984,927, filed on Mar. 4, 2020.

(56) References Cited

U.S. PATENT DOCUMENTS

| | | | |
|---|---|---|---|
| 6,062,299 | A | 5/2000 | Choo et al. |
| 6,212,074 | B1 | 4/2001 | Gonsalves et al. |
| 6,622,782 | B2 | 9/2003 | Malhammar |
| 8,176,972 | B2 | 5/2012 | Mok |
| 8,215,377 | B1 | 7/2012 | Monson et al. |
| 2002/0056542 | A1 | 5/2002 | Yamamoto et al. |
| 2002/0144804 | A1 | 10/2002 | Liang et al. |
| 2003/0024698 | A1* | 2/2003 | Bosak, III ............ H01L 23/367 257/E23.091 |
| 2004/0052052 | A1 | 3/2004 | Rivera |
| 2004/0188829 | A1 | 9/2004 | Hu et al. |
| 2008/0053640 | A1* | 3/2008 | Mok ...................... F28D 15/02 257/E23.091 |
| 2009/0040726 | A1* | 2/2009 | Hoffman ............ F28D 15/0233 29/890.032 |
| 2014/0233174 | A1 | 8/2014 | Demange |
| 2014/0360701 | A1 | 12/2014 | Aoki et al. |
| 2016/0118315 | A1 | 4/2016 | Smith et al. |
| 2016/0165757 | A1 | 6/2016 | Norton |
| 2017/0038154 | A1 | 2/2017 | Wang et al. |
| 2022/0276164 | A1 | 9/2022 | Aceti et al. |

FOREIGN PATENT DOCUMENTS

| | | |
|---|---|---|
| WO | 02/27785 A2 | 4/2002 |
| WO | 2016089385 A1 | 6/2016 |

OTHER PUBLICATIONS

European Patent Office, "International Search Report and Written Opinion," issued in related International Patent Application No. PCT/US2021/020950 mailed Jan. 7, 2021 (14 pages).

Babin, B.R., et al., "Experimental Investigation of a Flexible Bellows Heat Pipe for Cooling Discrete Heat Sources," Transactions of the ASME, vol. 112, pp. 602-607, Aug. 1990 (6 pages).

* cited by examiner

COMPLIANT THERMAL MANAGEMENT DEVICES, SYSTEMS, AND METHODS OF FABRICATION THEREOF

CROSS-REFERENCE TO RELATED APPLICATIONS

This application is a continuation of International Patent Application No. PCT/US2021/020950, filed on Mar. 4, 2021, which claims the benefit of priority to U.S. Provisional Patent Application No. 62/984,927, filed on Mar. 4, 2020, with the entire contents of each of these applications hereby incorporated herein by reference.

TECHNICAL FIELD

The disclosure generally relates to thermal management and, more specifically, to compliant thermal management.

BACKGROUND

Heat-dissipating components in electronic or photonic circuit packs are often cooled by coupling these components to a heat-receiving structure, such as a heat sink, a cold plate, the housing of a circuit pack, or an electromagnetic interference (EMI) shield. The total thermal resistance of the thermal path between the heat-dissipating components and the ambient increases with a degree of misalignment between the mating faces of the heat-dissipating components and the heat-receiving structure, such that a gap is present over a portion of one or more mating regions. For example, differences in the stack-up height or coefficients of thermal expansion (CTE) of the adjacent heat-dissipating components may result in some of the heat-dissipating components becoming fully detached from the heat-receiving structure.

In some instances, the thermal path between each heat-dissipating component and the heat-receiving structure is partially restored by filling the corresponding gap with an elastomeric gap filler or thermal paste/grease. These are much better conductors than air, but still have only moderate thermal conductivity (typically less than about 10 W/m/K) and tend to degrade over time. Thus, the use of both elastomers or thermal paste result in a thermal path with higher thermal resistance compared to thermal resistance in instances in which the mating surfaces are perfectly aligned and in touch with only a small amount of thermal paste used to fill in portions of the interface(s) where solid-to-solid contact is absent.

Accordingly, there remains a need for thermal management devices that accommodate geometric variations associated with heat-dissipating components while facilitating efficient heat transfer away from such heat-dissipating components.

SUMMARY

Thermal management devices, systems, and methods of fabrication thereof are generally directed to accommodating variability in height, shape, or other geometric features of one or more heat-dissipating components on a substrate while maintaining efficient transfer of heat away from the one or more heat-dissipating components. For example, a thermal management device may include a housing, a diaphragm, and a wick, the wick disposed along a chamber defined by the housing and the diaphragm such that a fluid within the chamber may evaporate and condense along the chamber to transfer heat away from one or more heat-dissipating components (e.g., electronic components or photonics). The diaphragm may be resiliently flexible relative to the housing to bias a contact surface of the diaphragm against one or more heat-dissipating components while maintaining efficient transfer of heat through the chamber and away from the one or more heat-dissipating components.

According to one aspect, a thermal management device may include a housing, a diaphragm including a contact surface, the diaphragm supported along the housing, and the housing and the diaphragm defining a chamber enclosed relative to the contact surface, at least one support in the chamber, and a wick including a first portion and a second portion, the first portion of the wick in contact with the housing, the second portion of the wick disposed in the chamber, between the at least one support and the diaphragm, and, in response to a force on the contact surface of the diaphragm, the diaphragm resiliently flexible relative to the housing and the at least one support to bias the contact surface of the diaphragm away from the chamber.

In certain implementations, the housing may include a first section and a second section, the diaphragm supported along the second section of the housing, and the at least one support extending, in the chamber, from the first section of the housing toward the diaphragm. For example, the first portion of the wick may be in contact with first section of the housing. As another example, the first portion of the wick may extend along an inner surface of the first section of the housing. Additionally, or alternatively, the thermal management device may include at least one core extending from the first section of the housing toward the diaphragm. In some instances, the first portion of the wick may be in contact with the at least one core. For example, the first portion of the wick circumscribes the at least one core. Further, or instead, the at least one core may include a plurality of cores arranged in a pattern circumscribing the one or more supports.

In certain implementations, one or more of the housing, the diaphragm, or the wick may be at least partially formed of metal.

In some implementations, the at least one support may have an elastic modulus greater than about 0.2 MPa and less than about 700 MPa.

In certain implementations, at least one of the first portion or the second portion of the wick includes one or more of a sintered material, a screen, a wire bundle, a grooved surface, or a combination thereof.

In some implementations, resilient flexibility of the diaphragm may change a shape of the second portion of the wick in the chamber. For example, the first portion of the wick in the chamber may retain a constant shape in the chamber as the diaphragm resiliently flexes to change the shape of the second portion of the wick in the chamber.

In certain implementations, the diaphragm may be coupled to a substantially planar surface of the housing, and the contact surface of the diaphragm is spaced apart from a plane defined by the substantially planar surface of the housing.

In some implementations, the contact surface may be substantially planar in the absence of an external force on the contact surface and has a periphery sized for engagement with the heat-dissipating component.

In certain implementations, the thermal management device may further include a fluid disposed in the chamber, the fluid in fluid communication with the first portion of the wick and the second portion of the wick. For example, the fluid may have a vaporization temperature greater than about −271° C. and less than about 2025° C. Additionally, or alternatively, the fluid includes one or more of nitrogen, water, alcohol, or sodium.

According to another aspect, a system may include a printed circuit board, at least one heat-dissipating component coupled to the printed circuit board, and a thermal management device including a housing, a diaphragm, at least one support, and a wick, the diaphragm having a contact surface, the housing and the diaphragm defining a chamber enclosed relative to the contact surface of the diaphragm, the wick disposed in the chamber with at least a portion of the wick between the at least one support and the diaphragm, and the diaphragm resiliently flexed relative to the housing and the at least one support such that the contact surface of the diaphragm is biased away from the chamber and into contact with the at least one heat-dissipating component coupled to the printed circuit board.

In certain implementations, the system may further include a heat exchanger coupled to the housing away from the diaphragm. For example, the heat exchanger may be coupled to a portion of the housing facing away from the heat-dissipating component. In some instances, the heat exchanger may include a heat sink having a plurality of fins. Additionally, or alternatively, the heat exchanger may include a cold plate.

According to yet another aspect, a method of fabricating a thermal management device may include positioning a first portion of a wick in contact with a housing, installing at least one support on a surface of the housing, positioning a second portion of the wick between the at least one support and a diaphragm, and enveloping the wick and the at least one support in a chamber defined by the housing and the diaphragm, the chamber enclosed relative to a contact surface of the diaphragm, and the diaphragm resiliently flexible, relative to the housing and the at least one support to bias the contact surface of the diaphragm against a heat-dissipating component.

In some implementations, positioning the first portion of the wick in contact with the housing includes arranging the first portion of the wick along a surface of the housing.

In certain implementations, positioning the first portion of the wick in contact with the housing may include arranging the first portion of the wick along at least one core extending, in the chamber, from a surface of the housing toward the diaphragm.

In some implementations, enveloping the wick and the at least one support in the chamber may include coupling the diaphragm in fluidically sealed engagement with the housing.

In certain implementations, enveloping the wick and the at least one support in the chamber may include forming a single fluid species environment in the chamber.

BRIEF DESCRIPTION OF THE DRAWING

Like reference symbols in the various drawings indicate like elements.

DETAILED DESCRIPTION

Figure 1:
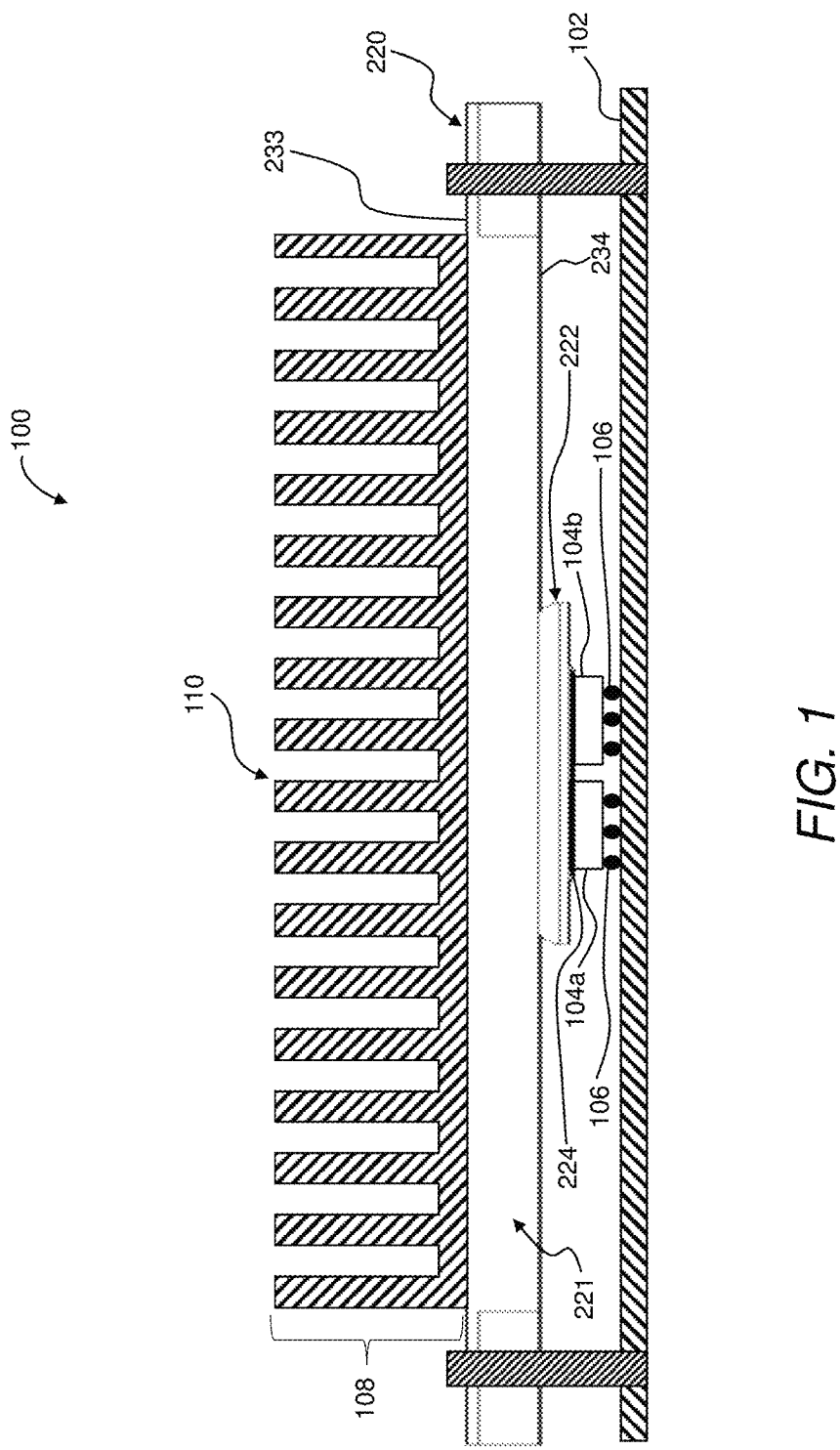
FIG. 1 is a schematic representation of a system including a thermal management device attached to a heat sink and to a heat-dissipating component mounted on a printed circuit board.

The embodiments will now be described more fully hereinafter with reference to the accompanying figures, in which preferred embodiments are shown. The foregoing may, however, be embodied in many different forms and should not be construed as limited to the embodiments set forth herein.

All documents mentioned herein are hereby incorporated by reference in their entirety. References to items in the singular should be understood to include items in the plural, and vice versa, unless explicitly stated otherwise or clear from the context. Grammatical conjunctions are intended to express any and all disjunctive and conjunctive combinations of conjoined clauses, sentences, words, and the like, unless otherwise stated or clear from the context. Thus, the term "or" should generally be understood to mean "and/or," and the term "and" should generally be understood to mean "and/or."

Recitation of ranges of values herein are not intended to be limiting, referring instead individually to any and all values falling within the range, unless otherwise indicated herein, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples or exemplary language ("e.g.," "such as," or the like) provided herein, is intended to better describe the embodiments and does not pose a limitation on the scope of the embodiments or the claims. No language in the specification should be construed as indicating any unclaimed element as essential to the practice of the disclosed embodiments.

As used herein, the term "heat-dissipating" component is used to refer to any one or more of various different types of electronic and/or optoelectronic components, unless otherwise specified or made clear from the context. Such heat-dissipating components may be present in any one or more of various different numbers and arrangements within a circuit pack, unless a contrary intent is explicitly set forth. By way of example, and not limitation, such heat-dissipating components may include field programmable gate arrays (FPGAs), microprocessors, laser drivers, optical amplifiers, lasers to generate light for transmission of information in fiber optic networks, or a combination thereof. Further, in each instance in which heat-dissipating components are described as being cooled herein, it shall be understood that any one or more of various different electronic and/or optoelectronic components may be additionally, or alternatively, heated by reversing a direction of heat transfer. Such heating may be useful, for example, for maintaining an electronic and/or optoelectronic component within a temperature range associated with rated performance, even though the component may be a heat-dissipating component.

Thus, stated differently, the term "heat-dissipating" component is used herein, as a matter of linguistic convenience, to refer to any one or more of various different electronic and/or optoelectronic components and shall not be understood to imply a direction of heat transfer. That is, unless otherwise specified or made clear from the context, any one or more of the various different thermal management devices described herein shall be understood to be operable to heat and/or cool one or more heat-dissipating components. More specifically, while a first portion of a thermal management device may be described as being a condenser and a second portion of the thermal management device may be described as being an evaporator, it shall be understood that these functions may be reversed according to an intended direction of heat transfer. For the sake of clear and efficient description such reversibility shall be understood and is not described separately in the description below.

In the description that follows, aspects of certain thermal management devices are described with respect to heat transfer from a pair of heat-dissipating components. It shall be appreciated that this is for the sake of clear and efficient description, and shall not be considered limiting. That is, unless otherwise specified or made clear from the context, any one or more of the various different aspects of thermal management devices and associated systems and methods of fabrication described herein shall be understood to be applicable to thermal management of any number of heat-dissipating components, unless otherwise specified or made clear from the context. Further, each heat-dissipating component may include any number of heat-dissipating sub-components, an examples of which include multichip modules in central processing units (CPUs), graphics processing units (GPUs), and fused CPU-GPU architectures. Such heat-dissipating sub-components may be in a bare die (unpackaged state). In other cases, all or some of the heat-dissipating sub-components may be individually packaged. Further, or instead, any one or more of the heat-dissipating components described herein may be packaged in a case. Heat-dissipating sub-components may be coupled to the case such that the case may act as a component-level heat receiving structure which, in turn, can be coupled to a circuit pack-level heat-receiving structure. Still further, or instead, heat-dissipating components with heat-dissipating sub-components may be themselves in a packaged configuration rather than in a bare die configuration. Further, or instead, heat-dissipating components described herein shall be understood to include multi-chip modules in which a plurality of chips are coupled to a lid of a multi-chip module or an analogous configuration with a bare die multi-chip module. Unless otherwise specified or made clear from the context, the foregoing and any other configurations of heat-dissipating components and/or heat-dissipating sub-components shall be understood to be within the subject matter of the present disclosure.

In the discussion that follows, the term "wick" shall be understood to include any manner and form of porous material along which a liquid may be absorbed along a first portion of a chamber of a thermal management device and distributed, without an external energy source, to a second portion of the chamber as part of a heating or cooling cycle carried out between the first portion of the chamber and the second portion of the chamber. Further, for the sake of convenience, the term "wick" shall be understood to include a continuous material, as well as discrete sections of material along which a liquid may be transported (e.g., via direct contact between discrete sections and/or via an artery), unless otherwise specified or made clear from the context.

Referring now to FIG. 1, a system 100 may include a printed circuit board 102, heat-dissipating components 104a,b (referred to collectively as the heat-dissipating components 104a,b and individually as the first heat-dissipating component 104a and the second heat-dissipating component 104b), and a thermal management device 220. Each one of the heat-dissipating components 104a,b may be coupled on the printed circuit board 102 (e.g., at a respective solder joint 106) in any one or more of various different arrangements suitable for a given circuit pack, such as an electronic circuit pack, optoelectronic circuit pack, or combinations thereof, used in computing and/or telecommunications hardware as found in telecommunications centers and data centers or as found in stand-alone systems (e.g., personal computers or lab equipment). The thermal management device 220 may include a housing 221 and a diaphragm 222. The diaphragm 222 may be supported along the housing 221 and in contact with each one of the heat-dissipating components 104a,b. As described in greater detail below, the diaphragm 222 may be resiliently flexible such that a contact surface 224 of the diaphragm 222 conforms to each one of the first heat-dissipating component 104a and the second heat-dissipating component 104b. Such resilient flexibility of the diaphragm 222 may, for example, reduce the likelihood of air gaps between the thermal management device 220 and the heat-dissipating components 104a,b by accommodating geometric variations (e.g., misalignment, thermal expansion mismatch, stack-up height variations, etc.) between the first heat-dissipating component 104a and the second heat-dissipating component 104b. As also described in greater detail below, the diaphragm 222 may be at least partially formed of one or more highly conductive materials (e.g., one or more metals, such as copper). Thus, as compared to thermal resistance associated with the use of thermal paste or elastomeric fillers to account for geometric variations between heat-dissipating components and a heat-receiving structure, the combination of resilient flexibility and high thermal conductivity of the diaphragm 222 may facilitate achieving a lower thermal resistance thermal path—and, thus, more efficient heat transfer—between the thermal management device 220 and each of the first heat-dissipating component 104 and the second heat-dissipating component. As further compared to the use of thermal paste or elastomeric fillers, the thermal management device 220 may additionally, or alternatively, facilitate assembly and offer advantages with respect to durability over time.

The thermal management device 220 may cool the heat-dissipating components 104a,b using an evaporation and condensation loop of a fluid, as described in greater detail below. In certain implementations, such cooling provided by the thermal management device 220 alone may maintain the heat-dissipating components 104a,b within a temperature range associated with reliable and prolonged operation of the heat-dissipating components 104a,b. In other implementations, however, the system 100 may additionally include a heat exchanger 108 coupled to the housing 221 of the thermal management device 220. For example, the heat exchanger 108 may be coupled to the housing 221 away from the diaphragm 222, to facilitate creating a temperature gradient away from the heat-dissipating components 104a,b, as may be useful for evaporating and condensing the fluid within the thermal management device 220 to cool the heat-dissipating components 104a,b. Further, or instead, the heat exchanger 108 may be coupled to a portion of the housing 221 facing away from the heat-dissipating components 104a,b, with such positioning being useful for sizing the heat exchanger 108 with a large surface area in some instances. As an example, the heat exchanger 108 may include a plurality of fins 110. In a position away from away from the heat-dissipating components 104a,b and, thus, away from the printed circuit board 102, the size of the plurality of fins 110 may be less likely to be constrained by the printed circuit board 102. Additionally, or alternatively, the heat exchanger 108 may include a cold plate such that a coolant (e.g., water) may flow through the heat exchanger 108 to draw heat away from the housing 221.

In general, referring now to FIG. 1 and FIGS. 2A-2D, the thermal management device 220 may include the housing 221, the diaphragm 222, at least one instance of a support 226 (referred to hereinafter as the support 226), and a wick 228. The housing 221 and the diaphragm 222 may define a chamber 230 enclosed relative to the contact surface 224 of the diaphragm 222 such that the contact surface 224 of the diaphragm 222 faces away from the chamber 230. The support 226 may be disposed in the chamber 230. While the diaphragm 222 may be a flexible material, the diaphragm 222 supported by the housing 221 and the support 226 may resist deformation of the diaphragm 222 into the chamber 230. That is, in response to a force on the contact surface 224 of the diaphragm 222, the diaphragm 222 may be resiliently flexible relative to the housing 221 and the support 226 to bias the contact surface 224 in a direction away from the chamber 230 and, thus, into contact with the heat-dissipating components 104a,b. As compared to a non-flexible interface with a heat-dissipating component, the resilient flexibility of the diaphragm 222 to bias the contact surface 224 into contact with the heat-dissipating components 104a,b may result in fewer (or smaller) air gaps and, thus, less thermal resistance along a thermal path from the heat-dissipating components 104a,b into the chamber 230. Additionally, or alternatively, as described in greater detail below, at least a portion of the wick 228 may be between the support 226 and the diaphragm 222 such that the wick 228 in the chamber 230 may flex to sustain performance of an evaporation/condensation cooling loop in the chamber 230, even as the diaphragm 222 resiliently flexes to facilitate establishing tight contact with heat-generating components along the contact surface 224.

To facilitate efficient heat transfer through the thermal management device 220, it shall be appreciated that any one or more of the housing 221, the diaphragm 222, or the wick 228 may be at least partially formed of one or more metals. Given that use of fluid cooling in the thermal management device 220, the one or more metals may include metals compatible with the fluid in the chamber 230. In this context, compatibility between the one or more metals and the fluid shall be understood to include a resistance to corrosion or other type of degradation in the presence of the fluid. Given its high thermal conductivity and compatibility across a wide range of common fluids, copper may be a particularly useful metal for forming at least a portion of one or more of the housing 221, the diaphragm 222, or the wick 228. Further, or instead, while a single metal may be used in a given element, it shall be appreciated that each element may be at least partially formed of a plurality of metals, as may be useful for achieving dimensional and/or cost constraints associated with a given application. As an example, the housing 221 may be formed of a first metal along the chamber 230 to promote heat transfer while being formed of a second metal along an outer portion of the housing 221 to achieve strength requirements. More generally, given that an intended use of the thermal management device 220 is to achieve efficient heat transfer, it shall be appreciated that any one or more of the components of the thermal management device 220 described herein may be at least partially formed of one or more metals, unless otherwise specified or made clear from the context.

The housing 221 may generally include a first section 231 and a second section 232 spaced apart from one another by at least a portion of the chamber 230. The first section 331 may be a condenser. Additionally, or alternatively, the second section 232 may be an evaporator. Thus, in operation of the thermal management device 220 as a heat pipe, a fluid may evaporate in the chamber 230 along the second section 232 and condense into a liquid in the chamber 230 along the first section 231. As described in greater detail below, the wick 228 may move the liquid, through capillary action, from the first section 231 of the housing 221 to the second section 232 of the housing 221 such that the evaporation and condensation cycle may be repeated to continually cool the heat-dissipating components in contact with the diaphragm 22 along the contact surface 224.

Given that the first section 231 and the second section 232 of the housing 221 must be spaced apart by at least a portion of the chamber 230 for proper operation of the thermal management device 220 as a heat pipe, the first section 231 and the second section 232 may each be rigid. In this context, rigidity shall be understood to be in comparison to the diaphragm 222. Given this rigidity, it shall be appreciated that the first section 231 and the second section 232 of the housing may be used to support the diaphragm 222. For example, the diaphragm 222 may be supported along the second section 232 of the housing 221 such that heat entering the chamber 230 via the contact surface 224 of the diaphragm 222 may be efficiently introduced into a liquid state of the fluid in the chamber 230 to heat the fluid to an evaporated state. Continuing with this example, the support 226 may extend from the first section 231 of the housing 221 toward the diaphragm 222 to support the diaphragm 222 relative to the chamber 230. That is, the first section 231 of the housing 221 may provide a backstop for the support 226 such that the support 226 resists movement of the diaphragm 222 into the chamber 230. In doing so, the support 226 may reduce the likelihood of inadvertently collapsing the diaphragm 222 into the chamber 230 in response to force of the heat-dissipating components 104a,b on the contact surface 224 of the diaphragm 222. As described in greater detail below, the support 226 may be elastically deformable to allow the diaphragm 222 to flex into the chamber 230 by a small amount, with the resulting compliance of the diaphragm 222 accommodating differences in geometry between the heat-dissipating components 104a,b.

In certain implementations, one or more of the first section 231 or the second section 232 may have a substantially planar outer surface. In this context, substantially planar shall be understood to refer to a surface having a surface area that is mostly flat, allowing for small variations within manufacturing tolerance. For example, the first section 231 may include a first substantially planar surface 233 to facilitate mounting any one or more of the various different heat exchangers described herein to the first section 231 and, in turn, facilitate maintaining a temperature differential between the first section 231 and the second section 232 of the housing 221. Further, or instead, the second section 232 of the housing 221 may include a second substantially planar surface 234 to facilitate manufacturability. As an example, as compared to other shapes, the second substantially planar surface 234 may be more easily located relative to the printed circuit board 102 and/or relative to the heat-dissipating components 104a,b. For example, the diaphragm 222 may be coupled to the second substantially planar surface of the second section 232 of the housing 221, and the contact surface 224 of the diaphragm 222 may be spaced apart from a plane defined by the second substantially planar surface 234. Such spacing may be useful for, among other things, accurately placing the contact surface 224 in contact with the heat-dissipating components 104a,b with a reduced likelihood of inadvertent contact with the second section 232 of the housing 221.

In general, the diaphragm 222 may have generally rounded features in the absence of an external force on the contact surface 224, and the contact surface 224 itself may change shape in response to an external force. At least because the rounded features of the diaphragm do not have high stress concentrations and changing the shape of the contact surface 224 of the diaphragm to accommodate the heat-dissipating components 104a,b does not require the use of joints, the diaphragm 222 may be particularly durable and robust through prolonged use. For example, as compared to flexing arrangements including bellows, the flexible shape of the diaphragm 222 itself along the contact surface 224 has fewer points of stress concentration prone to failure resulting from repeated cycling of force. Further, or instead, the flexible shape of the diaphragm 222 may facilitate achieving a high degree of stiffness that is typically not achievable using flexing arrangements, such as bellows, that include joints.

The diaphragm 222 may be secured to the housing 221 according to any one or more of various different techniques compatible with the shape, size, and composition of the diaphragm 222 and the shape, size, and composition of at least the second section 232 of the housing 221. More specifically, the diaphragm 222 and the second section 232 of the housing 221 may be secured in sealed engagement with one another to reduce the need for additional sealing components that may, ultimately, impact durability of the thermal management device 220. Thus, in some instances, the diaphragm 222 may be secured to the second section 232 of the housing 221 using techniques including any one or more of various different forms of welding, brazing, soldering, diffusion bonding, or combinations thereof. Further, or instead, in instances in which the diaphragm 222 includes a metallic (e.g., copper) foil, the diaphragm 222 may be secured to the housing 221 using one or more adhesives (e.g., a UV curable adhesive).

In some instances, the diaphragm 222 may be a unitary piece. This may be useful, for example, for forming the diaphragm 222 using stamping or another similar process. Further, or instead, forming the diaphragm 222 as a unitary piece may facilitate securing the diaphragm 222 independent of orientation. While the diaphragm 222 may be formed as a unitary piece having consistent properties throughout, the diaphragm 222 may alternatively be formed from a plurality of pieces. Such formation of the diaphragm 222 from a plurality of pieces may facilitate, for example, decoupling a flexibility profile of the diaphragm 222 from heat transfer properties of the diaphragm 222, as may be useful for achieving more efficient heat transfer compared to the use of a single piece formed of a single material.

As the interface with the heat-dissipating components 104a,b, the contact surface 224 of the diaphragm 222 may be any one or more of various different shapes useful for substantially conforming to the shape of the heat-dissipating components 104a,b with few, if any, air gaps therebetween. In implementations in which the heat-dissipating components 104a,b are similarly sized (e.g., with variations in size related to manufacturing tolerances, differences in thermal expansion, or combinations thereof), the contact surface 224 may advantageously be substantially planar in the absence of an outside force applied to the contact surface 224 and have a periphery sized for engagement with a heat-dissipating component. In this context, substantial planarity of the contact surface 224 shall be understood to include a surface deviating from ideal planarity according to normal manufacturing tolerances. Continuing with this example, the contact surface 224 having a substantially planar form factor may be useful for approximately uniform initial engagement with flat surfaces of the heat-dissipating components 104a,b, while flexibility of the contact surface 224 facilitate fine deviations from substantial planarity to conform the contact surface 224 to the heat-dissipating components 104a,b.

In general, the support 226 balances the challenge of providing a high degree of stiffness to the diaphragm 222 while also being compatible with physical constraints associated with being positioned within the chamber 230. That is, because the overall dimensions available within the chamber 230 are typically small for most circuit pack applications, the support 226 may advantageously provide a high degree of stiffness within a small size envelope compatible with the dimensions of the chamber 230. Further, because the support 226 displaces a volume of fluid that would otherwise be used in the evaporation/condensation loop within the chamber 230, the support 226 may advantageously provide a high degree of stiffness within a small volume.

As a specific and particularly useful implementation for balancing the disparate requirements of stiffness and size/volume within the chamber 230, the support 226 may be a monolithic shape (e.g., a cylindrical plug) having high elasticity. Advantageously, the stiffness of the monolithic shape having high elasticity is a result of the stiffness of the material itself. That is, as compared to a coil or another type of spring, the stiffness of such a monolithic shape with high elasticity does not require a specific geometry, beyond being wide enough to avoid buckling under typical forces exerted on the support 226 during normal use. Further, or instead, as compared to many types of springs, the monolithic shape is easy to manufacture, with little or no need for specialized equipment. As an example, support 226 formed as a monolithic shape may have an elastic modulus of greater than about 0.2 MPa and less than about 700 MPa (e.g., greater than about 0.3 MPa and less than about 50 MPa). The support 226 formed as a monolithic shape of a material having an elastic modulus within this range is particularly advantageous for providing sufficient stiffness within an efficient size envelope. As a more specific example, the support 226 may include one or more polymeric materials, examples of which include natural rubber, ethylene propylene diene monomer rubber (EPDM), neoprene, nitrile rubber, polyurethane rubber, fluoroelastomer, silicone rubber, butadiene rubber, styrene-butadiene rubber (SBR), chlorobutyl rubber, poly(ethylene-propylene) (EPM), hydrogenated nitrile rubber, epichlorohydrin homopolymer, epichlorohydrin copolymer, or combinations thereof. Further, or instead, the support 226 may include one or more aerogels having a predetermined elasticity and, in some cases, a material as solid skeleton.

In general, the wick 228 may be any one or more of various different types of wicks useful for moving a liquid state of a fluid from the first section 231 (the condenser section) to the second section 232 (the evaporator section) of the housing 221 as the thermal management device 220 operates as a heat pipe. For example, any one or more portions of the wick 228 may include one or more of a sintered material, a screen, a wire bundle, a grooved surface, or a combination thereof. Further, or instead, the wick 228 may have a pore size and/or particle size (in the case of sintered material) that facilitates meeting performance limits over a predetermined temperature range without being compromised by the capillary limit, boiling limit, entrainment limit, sonic limit, etc. Further, or instead, the support 226 or another similar structure in the chamber 230 may act as an artery to support the diaphragm 222 from collapsing at lower temperatures when the vapor pressure of the fluid in the chamber 230 is lower than during operation when the heat-dissipating 104a,b components are powered.

The wick 228 may, for example, include a first portion 236 and a second portion 238. In certain instances, the first portion 236 and the second portion 238 of the wick may be continuous from the first section 231 to the second section 232 of the housing 221. Further, or instead, the wick 228 may include discrete sections that are not directly coupled to one another but, nevertheless, form a continuous flow path of fluid moving along the wick 228, through capillary action, from the first section 231 to the second section 232 of the housing 221.

The first portion 236 of the wick 228 may be in contact with the housing 221, such as may be useful for facilitating conductive heat transfer from the first substantially planar surface 233 of the housing 221 to the first portion 236 of the wick 228 in the chamber 230. More specifically, the first portion 236 of the wick 228 may extend along an inner surface 240 of the first section 231 of the housing 221 to facilitate maintaining the first portion 236 along the first section 231 of the housing 221 at a temperature useful for condensing the fluid in the wick 228. In certain implementations, contact between the first portion 236 of the wick 228 may include coupling the first portion 236 of the wick 228 to the first section 231 of the housing. Such coupling may include, but is not limited to, spot welding, sintering, diffusion bonding, or a combination thereof.

The second portion 238 of the wick 228 may be disposed in the chamber 230, between the support 226 and the diaphragm 222. So positioned, the second portion 238 of the wick 228 may facilitate delivering fluid in a liquid phase to the second section 232 of the housing 221 and/or to the diaphragm 222, where the liquid phase of the fluid may evaporate to cool the second section 232 of the housing 221 and/or the diaphragm 222, as the case may be. With the heat-dissipating components 104a,b in contact with the contact surface 224 of the diaphragm 222, it shall be understood that such cooling of the diaphragm 222 imparts cooling to the heat-dissipating components 104a,b via thermal conduction through the diaphragm 222.

At least a segment of the second portion 238 of the wick 228 may change shape along with resilient flexing of the diaphragm 222 while the first portion 236 of the wick 228 retains a constant shape in the chamber 230. For example, the resilient flexibility of the diaphragm 222 may change a shape of the second portion 238 of the wick 228 in the chamber 230 at least along the diaphragm 222. That is, as the diaphragm 222 flexes into the chamber 230 in response to the force of the heat-dissipating components 104a,b on the contact surface 224, the second portion 238 of the wick 228 along the diaphragm 222 may undergo a corresponding amount of flexing to accommodate the change in shape of the diaphragm 222 while remaining near, if not in direct contact, with the diaphragm 222.

In some implementations, the thermal management device 220 may include one or more instances of a core 242 (referred to hereinafter as the core 242) extending from the first section 231 to the second section 232 of the housing 221. For example, the core 242 may extend from the first section 231 to the second section 232 of the housing 221 such that an axis defined by the core 242 extends through second portion 238 of the wick 228 along the diaphragm 222. The core 242 may, for example, provide support for the second portion 238 of the wick 228 as the second portion 238 of the wick 228 changes shape in response to resilient flexing of the diaphragm 222.

The core 242 may, for example, be coupled and/or integrally formed with the inner surface 240 of the first section 231 of the housing. Continuing with this example, the core 242 may be at least partially formed of one or more materials having a high thermal conductivity (e.g., one or more metals). Thus, as the first section 231 of the housing is cooled, conductive heat transfer along the core 242 may cool a portion of the chamber away from the inner surface 240 of the first section 231 of the housing. Such cooling may be useful for driving the evaporation/condensation cycle of the fluid in the chamber 230.

In certain implementations, the first portion 236 of the wick 228 may be in contact with the core 242 at least along the inner surface 240 of the first section 231 of the housing 221. Thus, to the extent liquid condenses on the core 242, such liquid may be collected in the first portion 236 of the wick 228. In some cases, the first portion 236 of the wick 228 may extend along the core 242 from the first section 231 of the housing 221 toward the second portion 238 of the wick 228 supported along the diaphragm 222. As a more specific example, the first portion 236 of the wick 228 may circumscribe the core 242 and extend along the core 242 from the first section 231 of the housing 221 toward the second portion 238 of the wick 228 supported along the diaphragm 222, as may be useful for providing structural support to the first portion 236 of the wick 228. In turn, such structural support of the first portion 236 of the wick 228 may be useful for maintaining a robust fluid flow path from the first portion 236 to the second portion 238 of the wick 228, even as the second portion 238 of the wick 228 changes shape in response to resilient flexing of the diaphragm 222.

Figure 3:
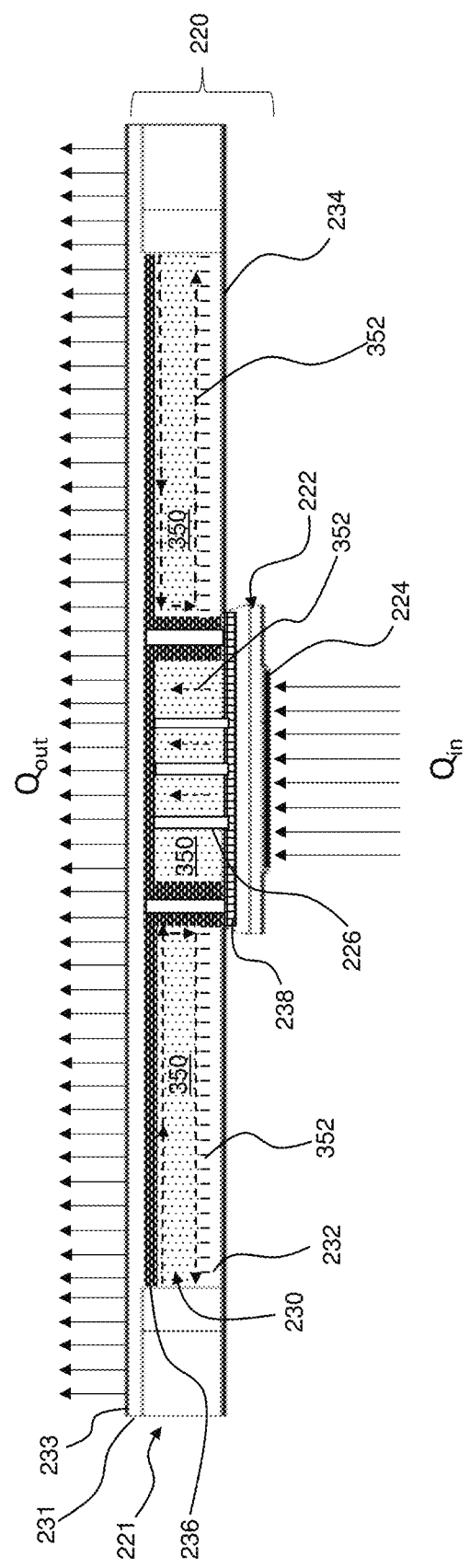
FIG. 3 is a schematic representation of evaporation and condensation of a fluid in the thermal management device of the system of FIG. 1.

FIG. 3 is a schematic representation of the evaporation/condensing cycle of the thermal management device 220 in operation as a heat pipe to cool heat-dissipating components (e.g., the heat-dissipating components 104a,b in FIG. 1). The thermal management device 220 may include a fluid 350 sealed in the chamber 230. It shall be appreciated that the fluid 350 is not shown in the other figures to facilitate identification and description of other features of the thermal management device 220. However, unless otherwise specified or made clear from the context, the fluid 350 shall be understood to present in the chamber 230 of any one or more of the various different thermal management devices described herein.

The fluid 350 may include any one or more of various different fluids suitable for vaporizing and condensing in a temperature range associated with a particular application, including applications ranging from cryogenic conditions to high temperature conditions. Thus, in general, the fluid may have a vaporization temperature greater than about −271° C. and less than about 2025° C. (e.g., greater than about −150° C. and less than about 300° C.). Examples of the fluid include, but are not limited to, one or more nitrogen, alcohol (e.g., ethanol), water, or sodium. In certain implementations, the fluid 350 may be a single fluid species in the chamber 230.

In general, the fluid 350 may be disposed in the chamber 230 in fluid communication with the first portion 236 and the second portion 238 of the wick 228. More specifically, input heat $Q_{in}$ generated by heat-dissipating devices (e.g., the heat dissipating components 104a,b) may move into the chamber 230 via the contact surface 224 of the diaphragm. With the second portion 238 of the wick 228 in contact with, or at least near, the diaphragm 222, the input heat $Q_{in}$ may come into contact with a liquid state of the fluid 350 in the second portion 238 of the wick 228. At least a portion of the input heat $Q_{in}$ may be absorbed by the fluid 350 in the second portion 238 of the wick 228 to vaporize the liquid state of the fluid 350 into a vapor state that may move (e.g., rise) along a vapor flow path 352 to move in an overall direction from the second portion 238 of the wick 228 toward the first portion 236 of the wick 228 along the first section 231 of the housing 221.

The first section 231 of the housing 221 may be actively cooled according to any one or more of the various different techniques described herein and/or passively cooled to remove output heat $Q_{out}$ from the chamber 230. Through removal of the output heat $Q_{out}$ via cooling of the first section 231 of the housing 221, the first section 231 of the housing 221 may be at a temperature below a condensation temperature of the fluid 250 in the chamber 230. With the first portion 236 of the wick 228 along the first section 231 of the housing 221, the first portion 236 of the wick 228 may also be below the condensation temperature of the fluid 350 such that the vapor phase of the fluid 250 may condense along any one or more portions of the first portion 236 of the wick 228.

Through capillary action in the wick 228, the liquid phase of the fluid 350 may move along a liquid path 354 from the first portion 236 of the wick 228 along the first section 231 of the housing 221 to the second portion 238 of the wick 228 at least along the diaphragm 222. In certain implementations, the second portion 238 of the wick 228 may further extend along all or a portion of the second portion 238 of the housing 221, as may be useful for providing a larger heat transfer surface area to facilitate cooling the diaphragm 222.

With the liquid state of the fluid 350 in the second portion 238 of the housing 221, the evaporation/condensation cycle may repeat. It shall be appreciated that, while the evaporation/condensation cycle has been described as a sequence of steps, the process may be continuous such that the fluid 350 is continually evaporating and condensing to cool the heat-dissipating components along the diaphragm 222. As compared to the use of thermal grease or other types of filler material, the resilient flexibility of the diaphragm 222 for improved engagement with heat-dissipating components may reduce the overall thermal resistance of the thermal management device 220 such that the thermal management device 220 may remove heat more efficiently.

FIGS. 4A-4H show an exemplary method of fabricating a thermal management device. Unless otherwise specified or made clear from the context, the exemplary method shown in FIGS. 4A-4H shall be understood to be applicable to forming any one or more of the various different thermal management devices described herein and, thus, shall be generally understood to be applicable to the fabrication of the thermal management device 220 (FIG. 1A and FIGS. 2A-2D).

Figure 2A:
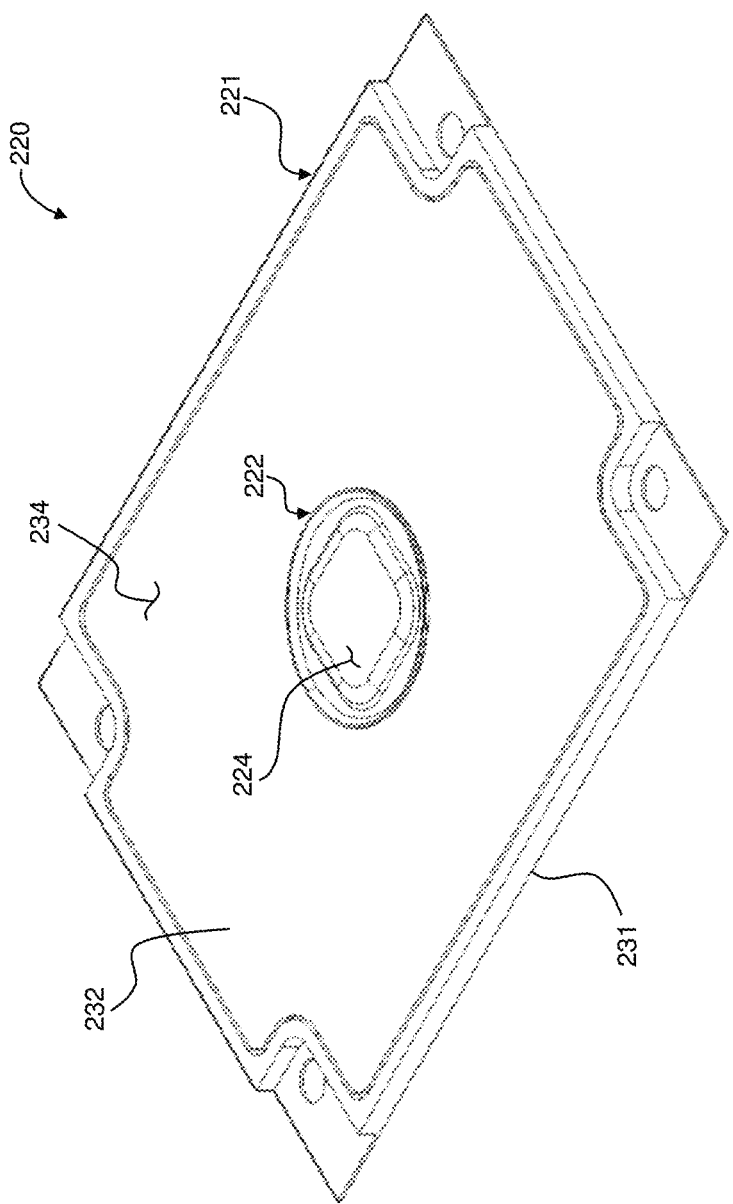
FIG. 2A is a perspective view of the thermal management device of the system of FIG. 1.
Figure 2B:
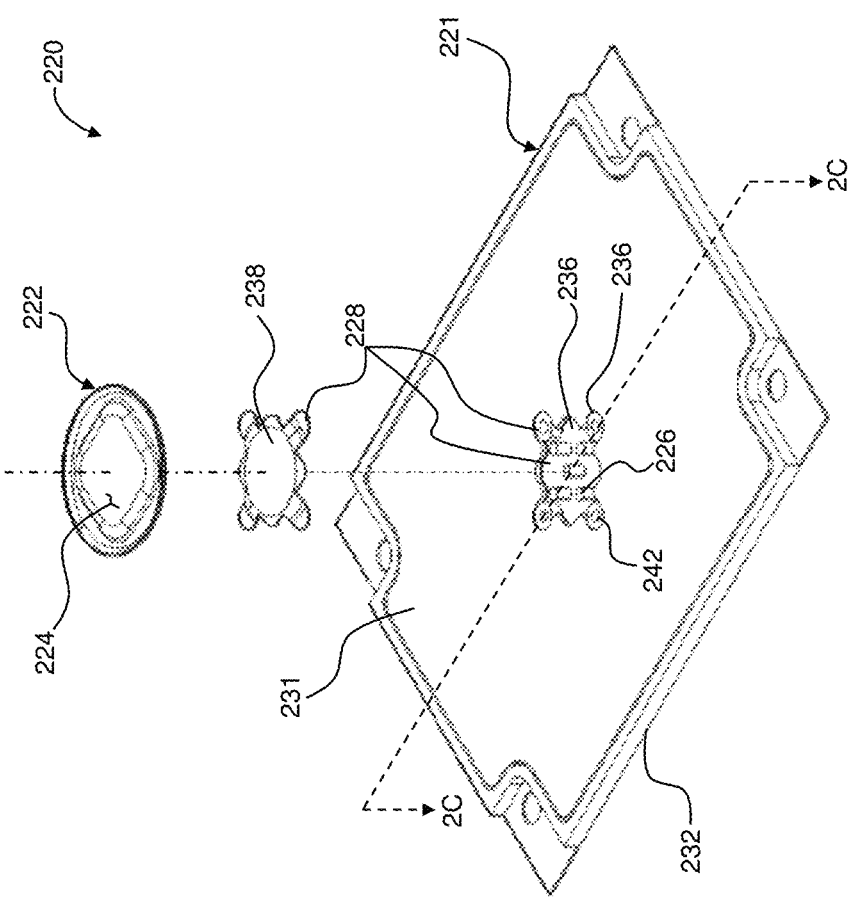
FIG. 2B is a partially exploded perspective of the thermal management device of FIG. 2A.
Figure 2C:
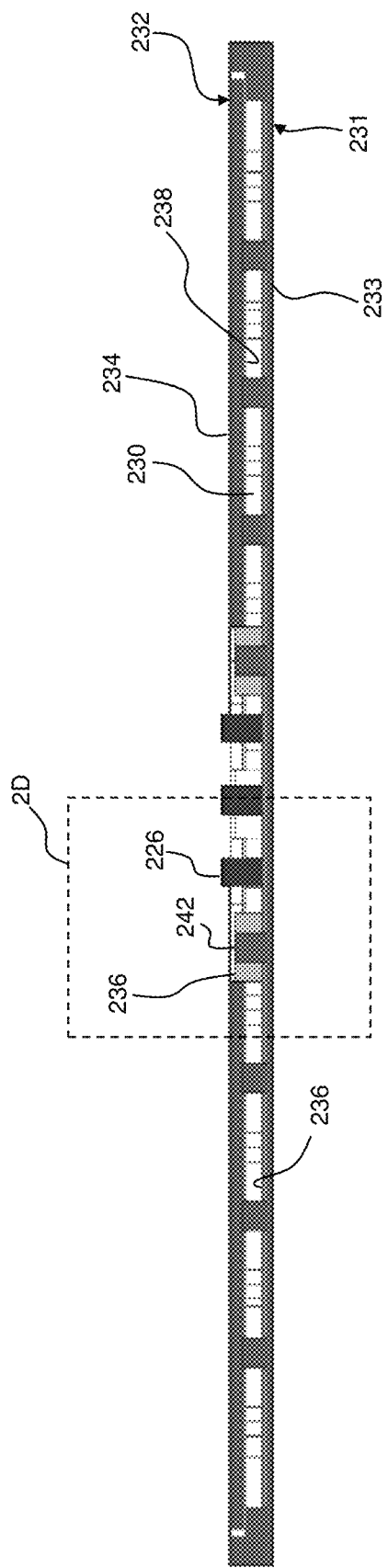
FIG. 2C is a side view of a cross-section of a portion of the thermal management device of FIG. 2A, the cross-section taken along the line 2C-2C in FIG. 2B.
Figure 2D:
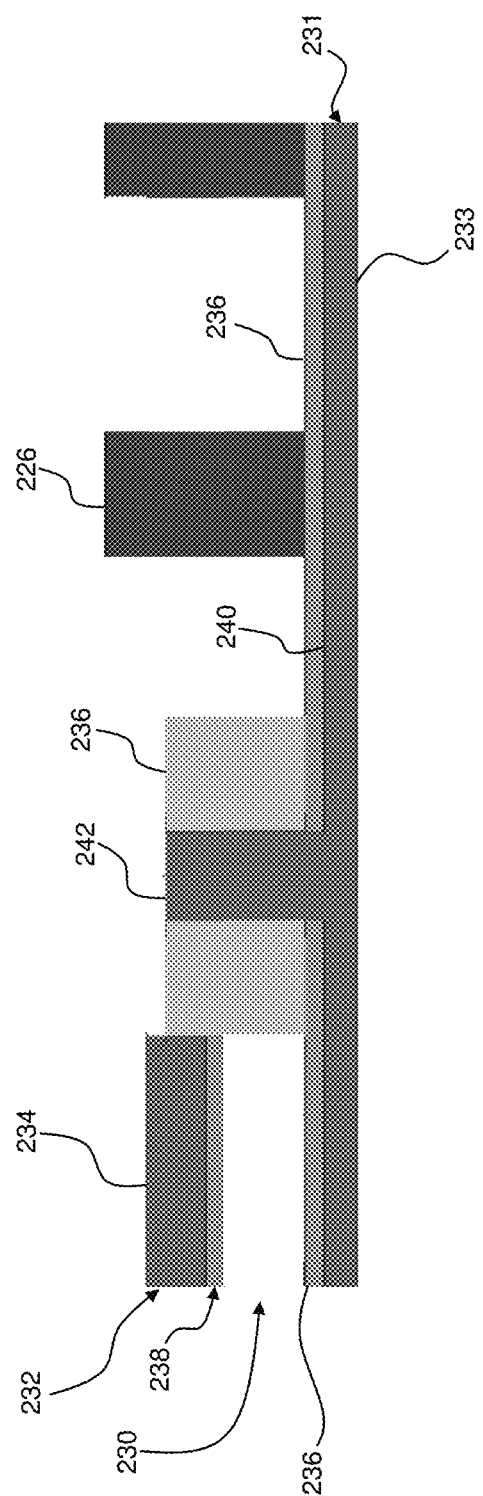
FIG. 2D is a side view of the area of detail 2D in FIG. 2C.
Figure 4B:
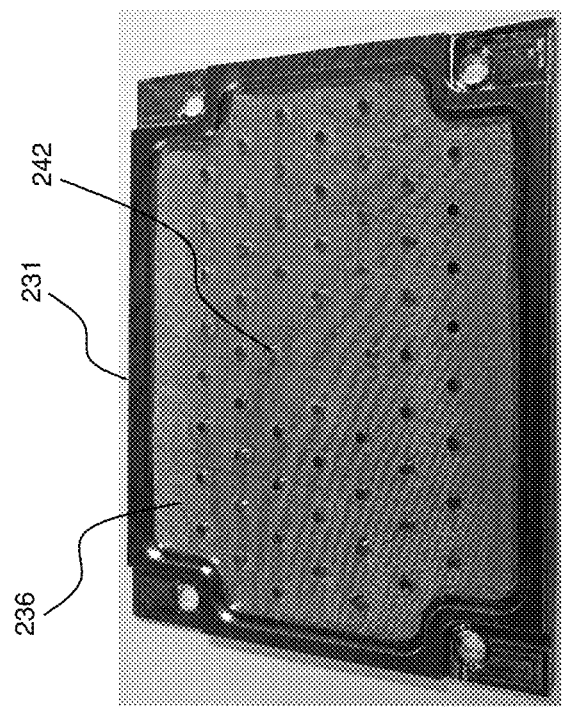
FIGS. 4A-4H are, collectively, a schematic representation of a method of fabricating a thermal management device.
Figure 4A:
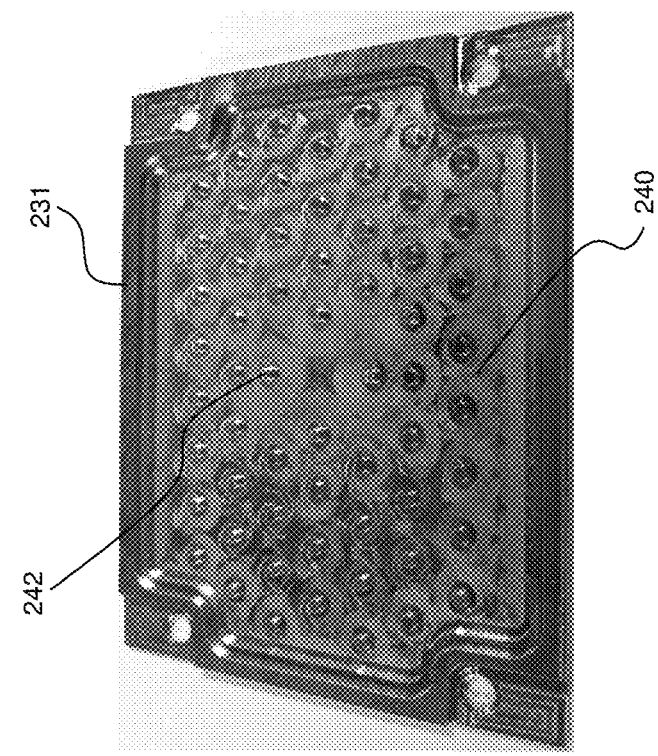
Figure 4D:
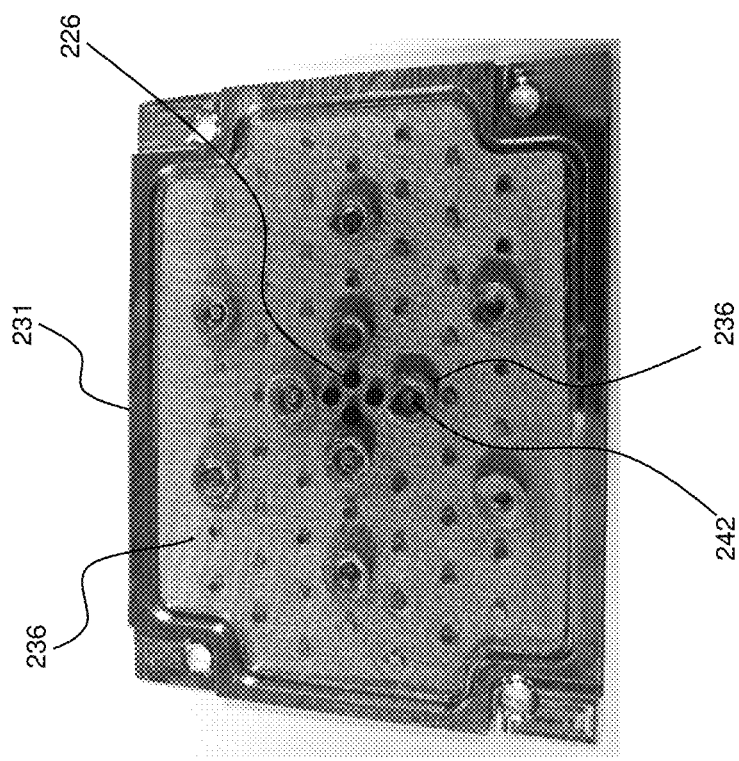
Figure 4C:
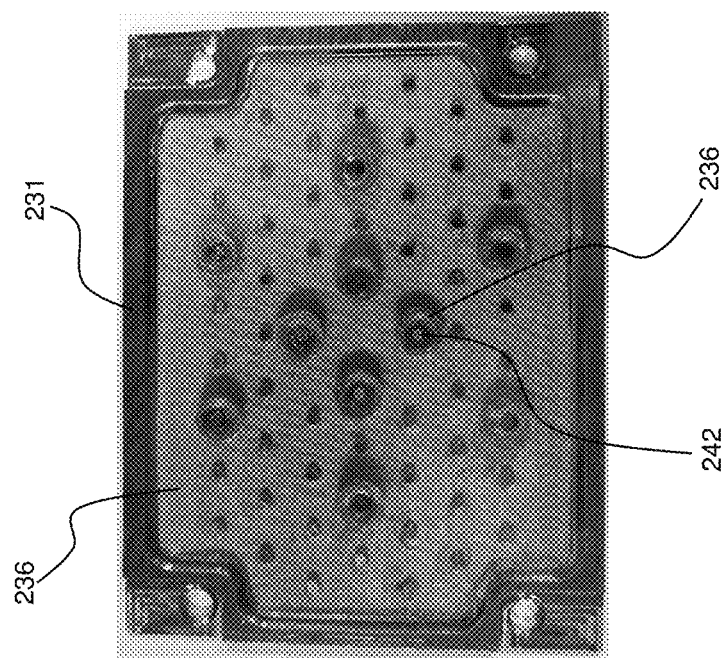
Figure 4F:
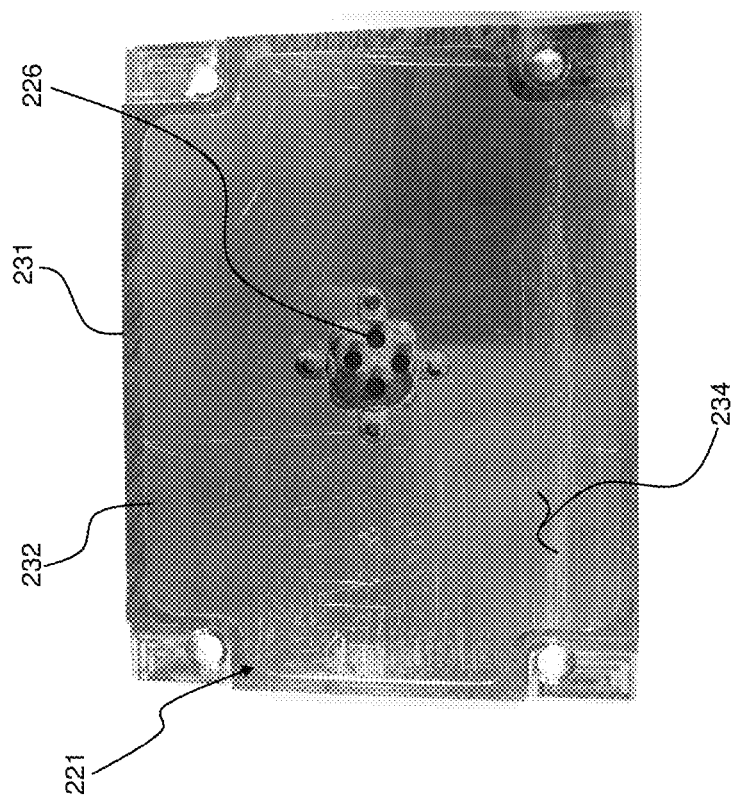
Figure 4E:
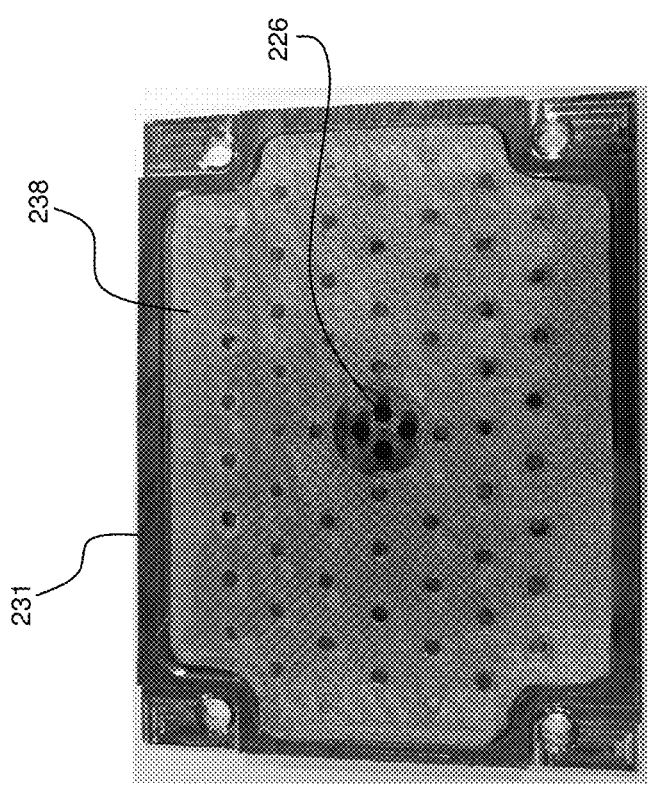
Figure 4H:
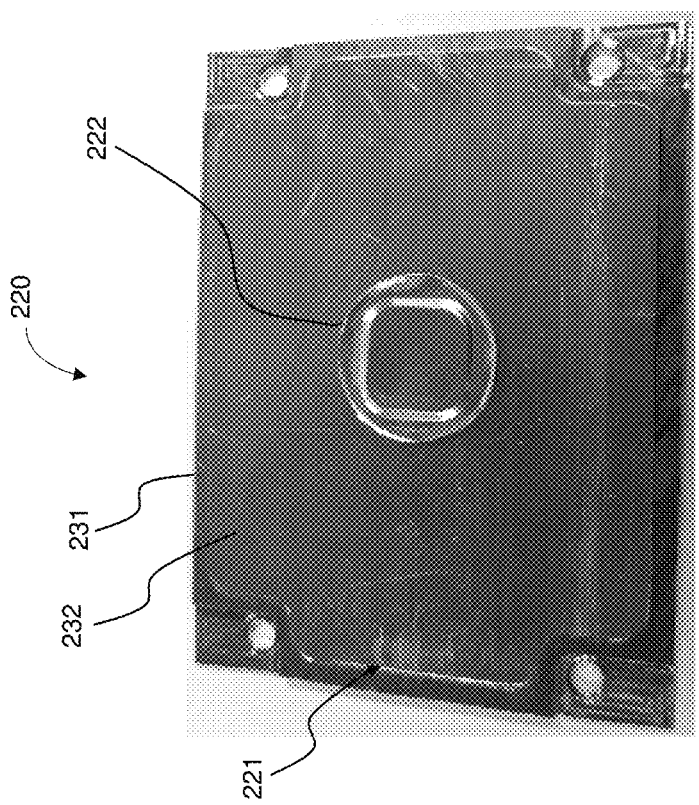
Figure 4G:
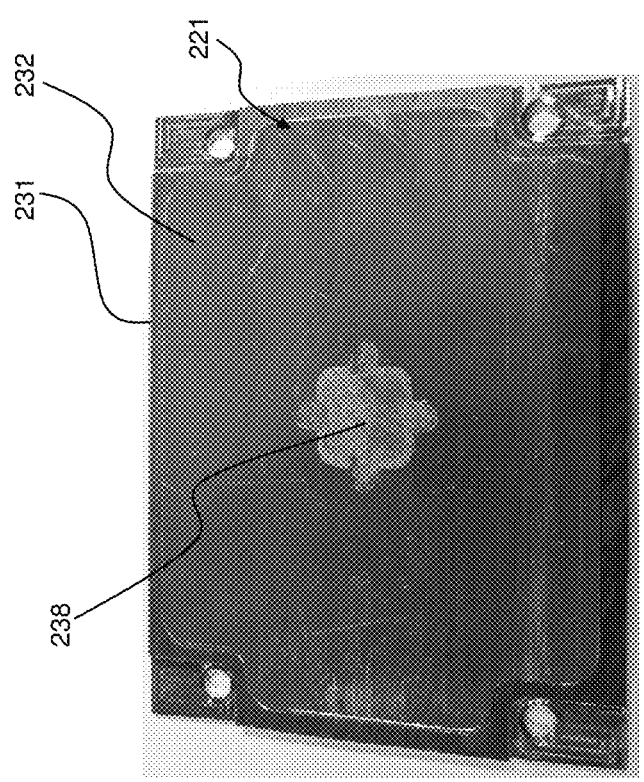

Referring now to FIGS. 4A-4C, an exemplary method of fabrication of thermal management device may include positioning the first portion 236 of the wick 228 in contact with a housing (e.g., with the first section 231 of the housing 221 (FIG. 1)). This may include, for example, covering the inner surface 240 of the first section 231 of the housing 221 (FIG. 1) with the first portion 236 of the wick 228 (FIG. 2B). Further, or instead, positioning the first portion 236 of the wick 228 (FIG. 2B) in contact with the first section 231 of the housing 221 (FIG. 1) may include securing the first portion 236 of the wick 228 (FIG. 2B) to the inner surface 240 using sintering, spot welding, and/or diffusion bonding. In certain implementations, positioning the first portion 236 of the wick 228 (FIG. 2B) in contact with the housing may include positioning the first portion 236 of the wick 228 (FIG. 2B) along the core 242 such that the first portion 236 of the wick 228 (FIG. 2B) extends in a direction away from the inner surface 240.

Referring now to FIGS. 4D-4H, the exemplary method of fabrication may include installing the support 226 on a surface of the housing (e.g., along the inner surface 240 of the first section 231 of the housing 221 (FIG. 1)). In particular, a plurality of instances of the support 226 may be positioned substantially evenly apart from one another to provide even support along the diaphragm 222.

Referring now to FIGS. 4E-4H, the exemplary method of fabrication may include positioning the second portion 238 of the wick 228 (FIG. 2B) between the support 226 and the diaphragm 222. For example, the second portion 238 of the wick 228 (FIG. 2B) may include a rigid segment positioned along the second section 232 of the housing 221 while a segment of the second portion 238 of the wick 228 beneath the diaphragm 222 may be flexible to move with the resilient flexing of the diaphragm 222.

Further, or instead, the exemplary method of fabrication may include enveloping the first portion 236 (FIG. 4B) and the second portion 238 of the wick 228 (FIG. 2B) and the support 226 in the chamber 230 defined by the housing 221 and the diaphragm 222. For example, enveloping may include forming a fluid tight seal (e.g., using diffusion bonding, welding, brazing, soldering, an adhesive, or a combination thereof) between the diaphragm 222 and the second section 232 of the housing 221. Further, or instead, enveloping may include forming a single fluid species environment in the chamber 230.

While certain implementations have been described, it shall be appreciated that other implementations are additionally or alternatively possible.

For example, while thermal management devices have been described as including substantially planar surfaces, it shall be appreciated that thermal management devices of the present disclosure may include other types of surfaces. For example, in some instances, a thermal management device may be securable to a heat-receiving structure (e.g., a heat exchanger) along a surface that is not substantially planar (e.g., due to geometric constraints). Accordingly, in such instances, a housing of the thermal management device may include one or more surfaces shaped to mate appropriately with the shape of the heat-receiving structure.

The method steps of the implementations described herein are intended to include any suitable method of causing such method steps to be performed, consistent with the patentability of the following claims, unless a different meaning is expressly provided or otherwise clear from the context. So, for example, performing the step of X includes any suitable method for causing another party such as a remote user, a remote processing resource (e.g., a server or cloud computer) or a machine to perform the step of X. Similarly, performing steps X, Y and Z may include any method of directing or controlling any combination of such other individuals or resources to perform steps X, Y and Z to obtain the benefit of such steps. Thus, method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It will be appreciated that the devices, systems, and methods described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the spirit and scope of this disclosure and are intended to form a part of the invention as defined by the following claims, which are to be interpreted in the broadest sense allowable by law.

What is claimed is:

1. A thermal management device comprising:
   a housing;
   a diaphragm including a contact surface, the diaphragm supported along the housing, and the housing and the diaphragm defining a chamber enclosed relative to the contact surface;
   at least one support in the chamber; and
   a wick including a first portion and a second portion,
     the first portion of the wick in contact with the housing,
     the second portion of the wick disposed in the chamber, between the at least one support and the diaphragm, and,
     in response to a force on the contact surface of the diaphragm, the diaphragm resiliently flexible relative to the housing and the at least one support, the resilient flexibility of the diaphragm biasing the contact surface of the diaphragm away from the at least one support in the chamber.

2. The thermal management device of claim 1, wherein the housing includes a first section and a second section, the diaphragm supported along the second section of the housing, and the at least one support extending, in the chamber, from the first section of the housing toward the diaphragm.

3. The thermal management device of claim 2, wherein the first portion of the wick is in contact with the first section of the housing.

4. The thermal management device of claim 3, wherein the first portion of the wick extends along an inner surface of the first section of the housing.

5. The thermal management device of claim 3, further comprising at least one core extending from the first section of the housing toward the diaphragm.

6. The thermal management device of claim 5, wherein the first portion of the wick is in contact with the at least one core.

7. The thermal management device of claim 6, wherein the first portion of the wick circumscribes the at least one core.

8. The thermal management device of claim 5, wherein the at least one core includes a plurality of cores arranged in a pattern circumscribing the one or more supports.

9. The thermal management device of claim 1, wherein one or more of the housing, the diaphragm, or the wick is at least partially formed of metal.

10. The thermal management device of claim 1, wherein the at least one support has an elastic modulus greater than about 0.2 MPa and less than about 700 MPa.

11. The thermal management device of claim 1, wherein at least one of the first portion or the second portion of the wick includes one or more of a sintered material, a screen, a wire bundle, a grooved surface, or a combination thereof.

12. The thermal management device of claim 1, wherein resilient flexibility of the diaphragm changes a shape of the second portion of the wick in the chamber.

13. The thermal management device of claim 1, wherein the diaphragm is coupled to a substantially planar surface of the housing, and the contact surface of the diaphragm is spaced apart from a plane defined by the substantially planar surface of the housing.

14. The thermal management device of claim 1, further comprising a fluid disposed in the chamber, the fluid in fluid communication with the first portion of the wick and the second portion of the wick.

15. The thermal management device of claim 1, wherein the support has a monolithic shape that is elastically deformable in response to flexing of the diaphragm into contact with the support in the chamber.

16. The thermal management device of claim 15, wherein the support includes one or more polymeric materials.

17. A system comprising:
   a printed circuit board;
   at least one heat-dissipating component coupled to the printed circuit board; and
   a thermal management device including a housing, a diaphragm, at least one support, and a wick,
     the diaphragm having a contact surface,
     the housing and the diaphragm defining a chamber enclosed relative to the contact surface of the diaphragm,
     the wick disposed in the chamber with at least a portion of the wick between the at least one support and the diaphragm, and
     the diaphragm resiliently flexible relative to the housing and the at least one support, the resilient flexibility of the diaphragm biasing the contact surface of the diaphragm away from the at least one support in the chamber and into contact with the at least one heat-dissipating component coupled to the printed circuit board.

18. The system of claim 17, further comprising a heat exchanger coupled to the housing away from the diaphragm.

19. The system of claim 18, wherein the heat exchanger is coupled to a portion of the housing facing away from the heat-dissipating component.

* * * * *